US012687409B2

(12) United States Patent
Bruwer et al.

(10) Patent No.: US 12,687,409 B2
(45) Date of Patent: Jul. 21, 2026

(54) INDUCTIVE MOVEMENT SENSOR

(71) Applicant: AZOTEQ HOLDINGS LIMITED, Nicosia (CY)

(72) Inventors: Frederick Johannes Bruwer, Paarl (ZA); Daniel Barend Rademeyer, Paarl (ZA); Jean Viljoen, Paarl (ZA); Frederick Johannes Bruwer, Jr., Paarl (ZA)

(73) Assignee: AZOTEQ HOLDINGS LIMITED, Nicosia (CY)

( * ) Notice: Subject to any disclaimer, the term of this patent is extended or adjusted under 35 U.S.C. 154(b) by 204 days.

(21) Appl. No.: 18/591,567

(22) Filed: Feb. 29, 2024

(65) Prior Publication Data

US 2024/0295415 A1     Sep. 5, 2024

(30) Foreign Application Priority Data

Mar. 3, 2023    (ZA) .................................. 2023/03284
Apr. 13, 2023    (ZA) .................................. 2023/04361

(51) Int. Cl.
*G01D 5/20* (2006.01)
*G01D 5/24* (2006.01)
*G06F 3/0338* (2013.01)
*G01R 27/26* (2006.01)

(52) U.S. Cl.
CPC ................. *G01D 5/20* (2013.01); *G01D 5/24* (2013.01); *G06F 3/0338* (2013.01); *G01R 27/2605* (2013.01)

(58) Field of Classification Search
CPC ...... G01R 27/00; G01R 27/02; G01R 27/026; G01R 27/2605; G01D 5/00; G01D 5/12; G01D 5/14; G01D 5/20; G01D 5/2006; G01D 5/2013; G01D 5/24; G06F 3/00; G06F 3/01; G06F 3/03; G06F 3/033
USPC ..... 324/200, 207.11, 207.13, 207.15, 207.16
See application file for complete search history.

(56) References Cited

U.S. PATENT DOCUMENTS

| | | | | |
|---|---|---|---|---|
| 3,596,173 | A | * | 7/1971 | Cohen ..................... H01F 29/10 |
| | | | | 336/92 |
| 5,462,525 | A | * | 10/1995 | Srisathapat ....... A61M 5/14276 |
| | | | | 604/67 |
| 5,532,588 | A | * | 7/1996 | Kyriakis ................ G01B 7/312 |
| | | | | 324/226 |

FOREIGN PATENT DOCUMENTS

| | | | | | |
|---|---|---|---|---|---|
| CN | 102645673 | A | * | 8/2012 | ......... H03K 17/9525 |
| CN | 107110668 | A | * | 8/2017 | ........... G01D 5/2013 |
| CN | 110954735 | A | * | 4/2020 | ......... G01R 19/0092 |
| DE | 102006020602 | A1 | * | 11/2007 | ........... G01D 5/2013 |

\* cited by examiner

*Primary Examiner* — Hoai-An D. Nguyen
(74) *Attorney, Agent, or Firm* — Mattingly & Malur, PC

(57) ABSTRACT

A measuring technique, useful in diverse applications such as in joysticks and power tools, wherein an interfering member is positioned so that upon movement e.g. by a user a magnetic field, established by a solenoid coil, is altered and a change in a measured inductance of the coil is related to the position, or the extent of movement of the interfering member, relative to the coil.

18 Claims, 9 Drawing Sheets

INDUCTIVE MOVEMENT SENSOR

CROSS-REFERENCE TO RELATED APPLICATION

The present application claims priority from South Africa application ZA 2023/03284, filed Mar. 3, 2023, and ZA 2023/04361, filed Apr. 13, 2023, the contents of which are hereby incorporated by reference into this application.

BACKGROUND OF THE INVENTION

There is a requirement for fast and accurate rotation, circular or linear motion sensing measurements in many applications, for example (but not limited to) in gaming joysticks (thumb sticks), triggers (gaming, power tools etc.) and switches (keyboards).

The prior art solutions include mostly rheostat, Hall-effect and ohmic contact based solutions.

Rheostat and ohmic solutions often suffer from wear and tear. In a rheostat, a wiper also creates friction that can impede a return to a zero, neutral or release position. A Hall effect device is contactless but still has drawbacks associated with costs (magnets, Hall-effect sensor per location) and more recently (circa 2022) the interference from using multiple Hall-effect magnet pairs per product.

Figure 1A:
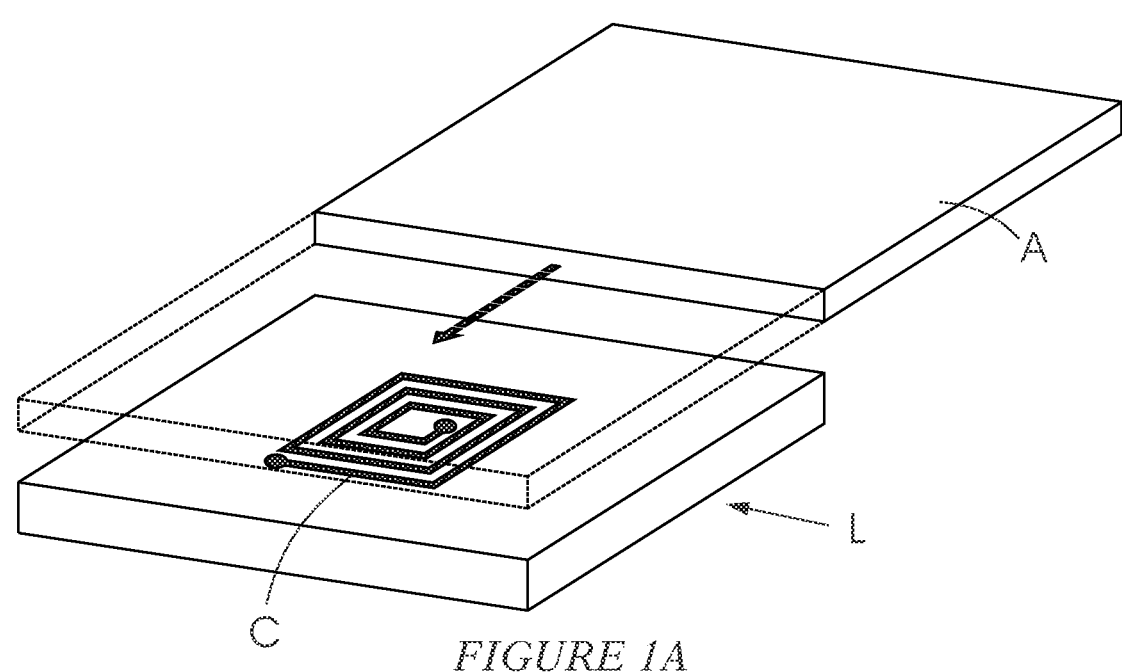
Figure 1B:
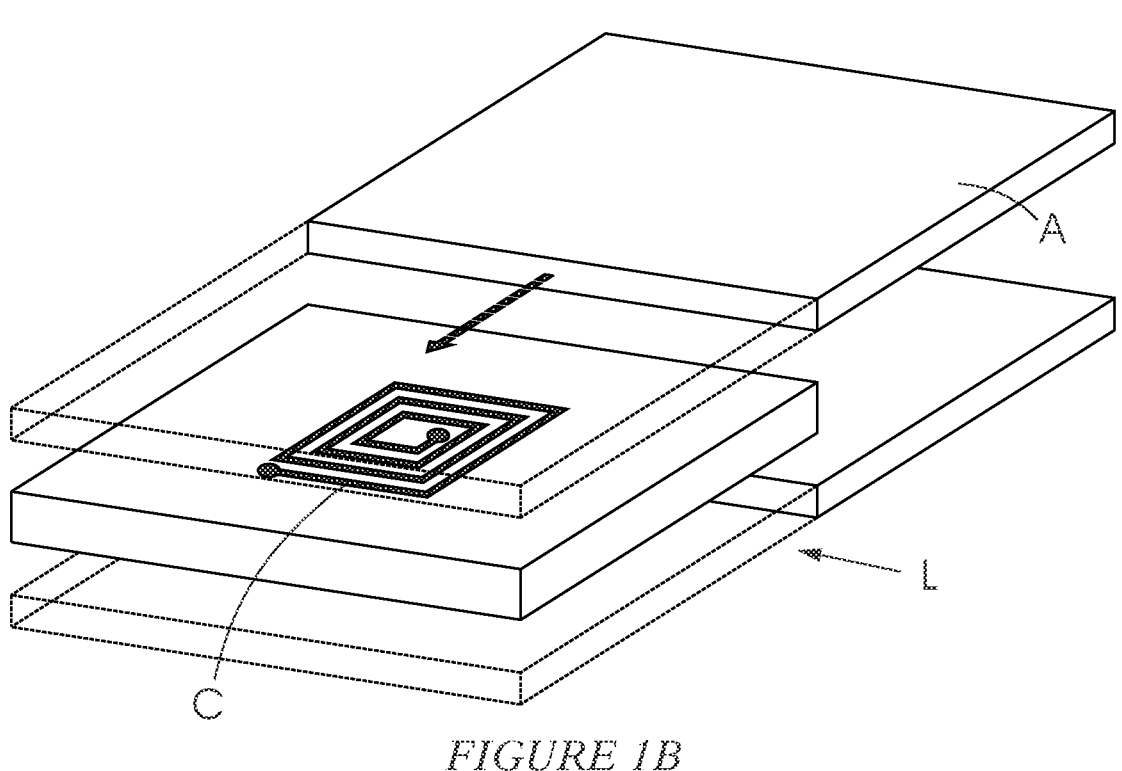
Figures 2, 3A, 3B:
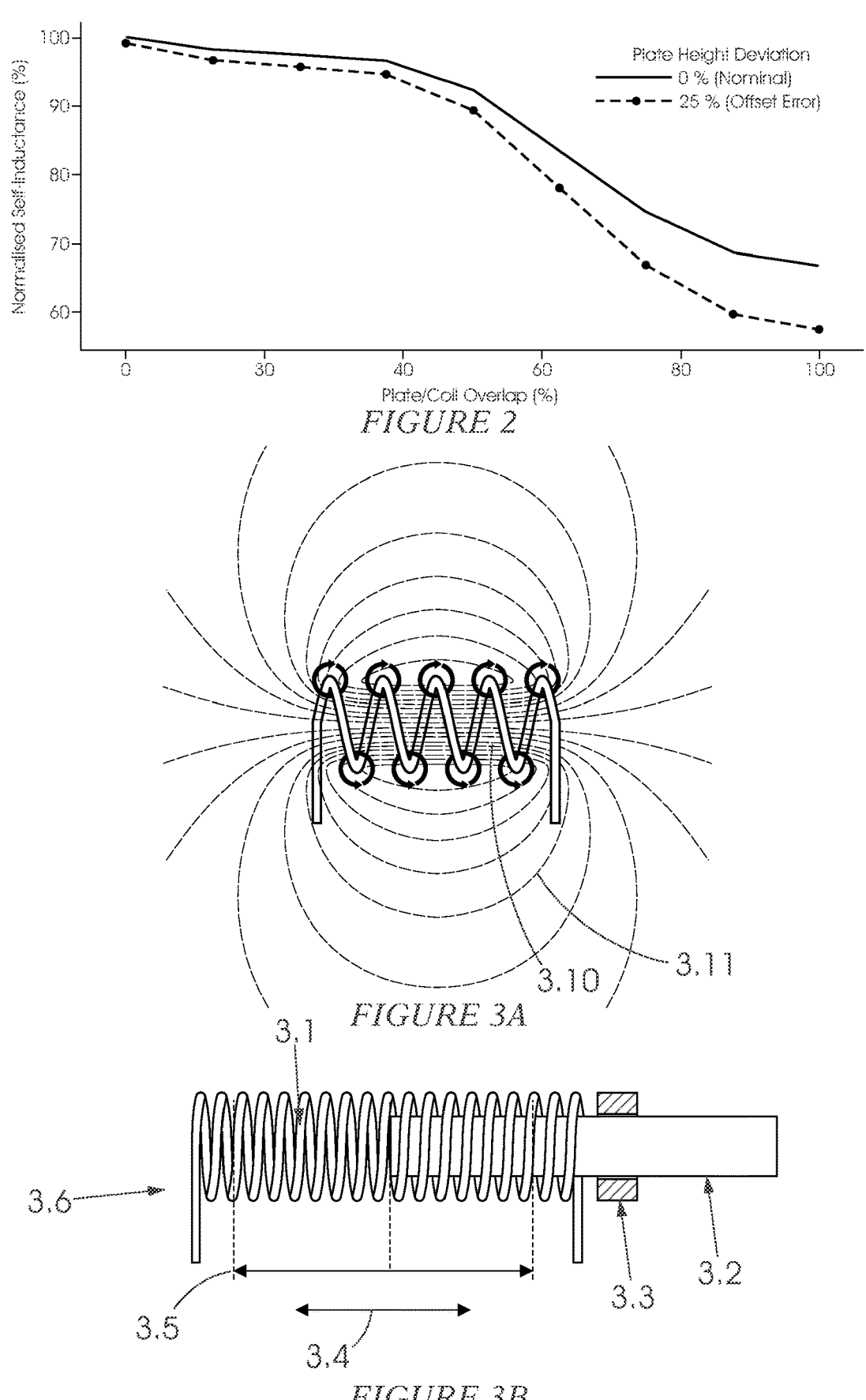

From the prior art and theory it is clear that the movement of a conductive object, such as an iron plate A, across a flat coil C that forms an inductor (L), will influence the inductance metric (the measurement of the inductance) due to Eddy currents forming in the object (see FIGS. 1A, 1B). The change in inductance is quite linear as the object moves across regions of the inductor. However, if the object is in close proximity to the inductor, movement nearer to, and further from, the inductor may induce a similar or even a bigger change in the inductance than movement across the inductor (FIG. 2). Thus, unless absolute stability in distance between the object and the inductor can be guaranteed this implementation has some inherent problems with noise or jitter.

In this patent application, the use of inductive sensing solutions is described in several applications with clear improvements shown with regard to the state of the art.

The patent application is not limited to the examples shown or discussed but should be read in the wide application of the invention.

SUMMARY OF THE INVENTION

In an embodiment of this invention a space inside a solenoid coil, that forms an inductor (L) is disturbed. A disturbance is effected by using a conductive (or ferrite) interfering member (FIG. 3). If, in cross section, the inductor core is circular, the interfering member should be circular. If the inductor (L) core shape is rectangular then the interfering member could be rectangular. The concept is that the interfering member must fill a substantial part of the cross sectional area of the inductor core. In that sense a hexadecimal or many sided (polygonal) interfering member may still adequately affect an inductor (L) with a circular core. By moving the interfering member to fill more or less (in and out) of the core space the inductance of the inductor (L) is changed. This change is measurable and is related to the displacement or position of the interfering member.

An advantage of this construction is that because the magnetic flux inside the core of the inductor is quite uniform, movement sideways (i.e. not in and out of the core)

does not result in a significant change of the inductance value. Whereas moving the interfering member into or out of the core has a direct and consistent measurable effect on the inductance of the inductor (L). This provides for a much more stable measurement solution related to movement in a direction (FIG. 4) to either fill more of the core area or less of the core volume.

Figures 4, 5, 6:
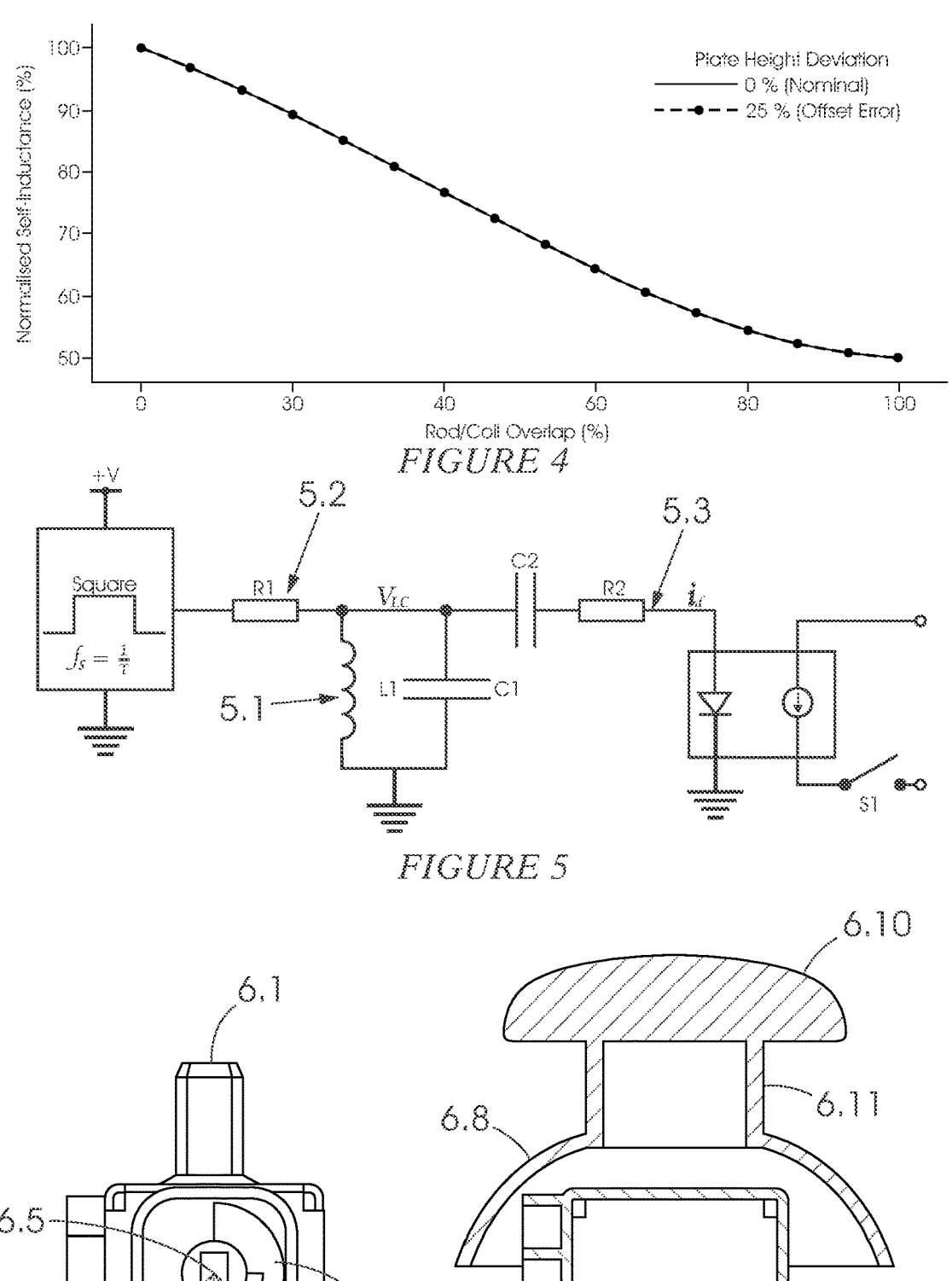

FIG. 6 illustrates an application of this invention applied to a movement sensor, typically found in a joystick.

This embodiment of the invention also differs from a rheostat solution in that no wiper or slipring contacts are required to make a measurement of rotation. A contact such as a wiper creates resistance to movement whereas in this case no contact is required. In particular a contact which is linked to movement creates friction and wear and tear.

In a further embodiment relating, say, to a joystick a measurement circuit in an integrated circuit that measures inductance can also measure capacitance to determine if there is any "touch" from a user. If it is determined that there is no touch it may be assumed that the joystick will return quickly to a zero (also termed neutral or release) position. This can be used for continuous calibration and/or faster responses. Information regarding contact by a user can also be used to reduce current consumption by slowing inductive measurement frequency and disabling some other operations when a state of no-contact is determined through the capacitive or other measurement.

An interfering member may be partly insertable into the length of the inductor (L) core at a zero position. For a typical joystick or thumb stick movement to each side is about 30 degrees per axis. In an embodiment of the invention the inductor length is chosen to cover more than 60 degrees (for example 90 degrees). For the zero position of the joystick the interfering member is entered for example halfway into the core. Full motion to either side leaves the interfering member still well inside the core to avoid fringe effects and improve linearity.

In this arrangement the inductor preferably has a curved shape.

Non-linearities can also be mathematically reduced with calibration techniques at manufacturing or design stages or with appropriate shaping of the interfering member.

The interfering member may be tapered or otherwise shaped to improve movement range or linearity. This will be further elaborated on below.

In another embodiment of the invention an inductor is formed on a printed circuit board (pcb) in the shape of a spiral (FIG. 8), square or other shape, with a hole through the pcb in the centre of the inductor. The inductor may be formed on a single side, or on both sides, of the pcb which may lie in a plane.

A conductive rod or ferrite interfering member may be moved through the hole in the inductor. This results in a change in the inductance of the inductor as displayed (FIG. 4). The objective is not an absolute measurement of inductance but rather determining a metric of the change resulting from the movement of the conductive/ferrite member into the center hole in the pcb inductor.

The conductive/ferrite interfering member may be in the form of a rod or wire with a flat end penetrating the hole. The change in inductance related to the movement is closely linked to the thickness of the pcb or, in the case of a single sided coil, to the thickness of the coil and the diameter of the coil. In some applications this may not yield enough travel distance that results in inductance change. For example, a standard key in a desktop keyboard may be required to travel more than 4 mm. In order to increase the distance of travel

US 12,687,409 B2

Figure 8:
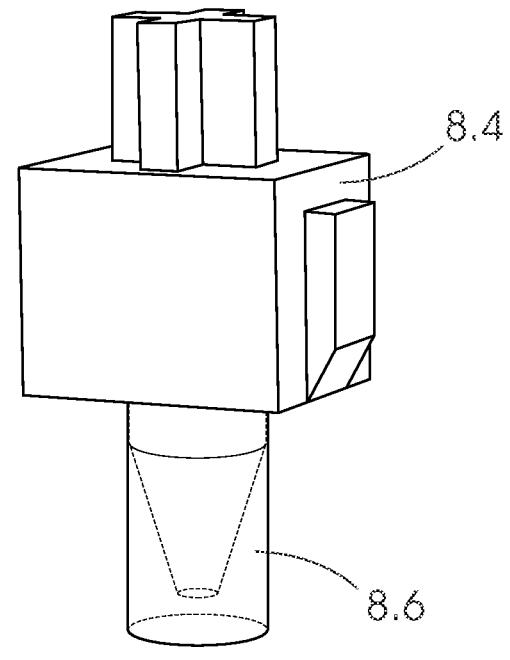
Figure 8:
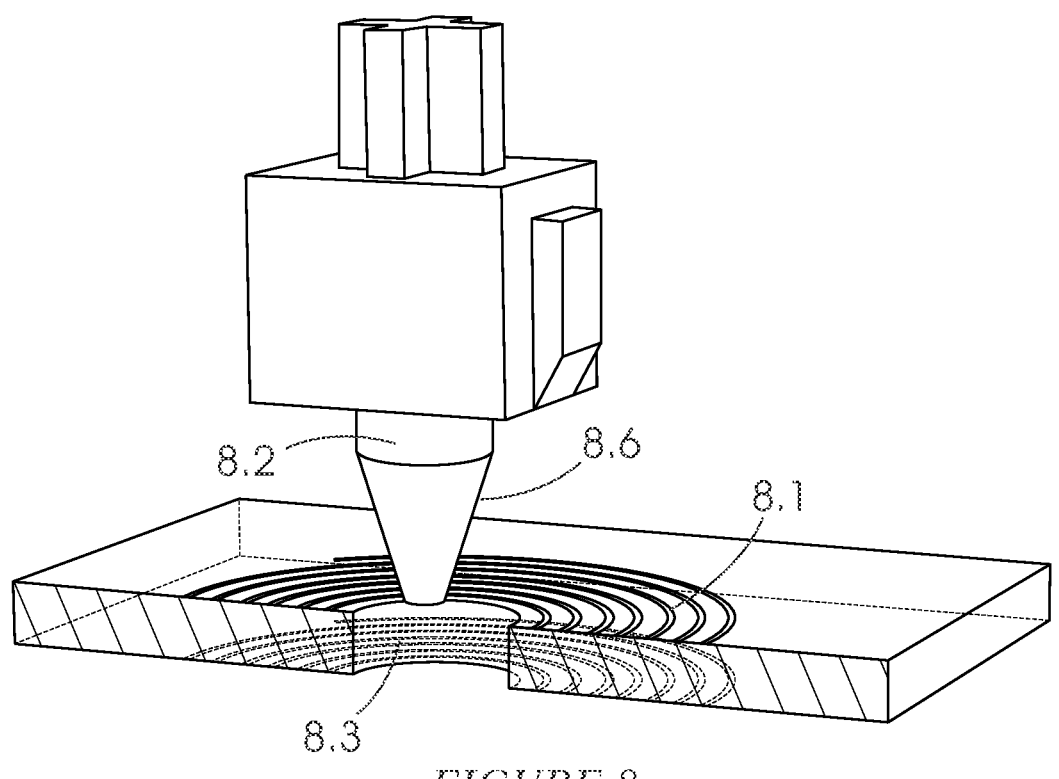

3 resulting in continuous change of the inductance the interfering member may be shaped for example to resemble the writing end of a pencil. (FIG. 8). (This is non-limiting).

In a further embodiment the interfering member is fitted with a guide e.g. of plastic to keep it positioned in the hole i.e. with limited side movement, or it may in fact travel within a non-conductive plastic housing that is fitted and not moving inside the hole in the center of the inductor. The inductor may be formed using tracks on a pcb.

The interfering member may be shaped to linearize the change in inductance in relation to the displacement experienced. The interfering member may also be shaped to provide step changes or a clear starting point.

Another form of inductor for example a cylindrical coil can also be used to implement a switch. But for something like a keyboard it is cost effective and practical to place or form the inductor as part of the pcb layout. This is at minimal or zero cost. By using a double sided coil, the number of windings per side may be reduced, in effect reducing the diameter per coil. This in turn allows more coils to be fitted per unit area, and limits crosstalk.

Figure 9A:
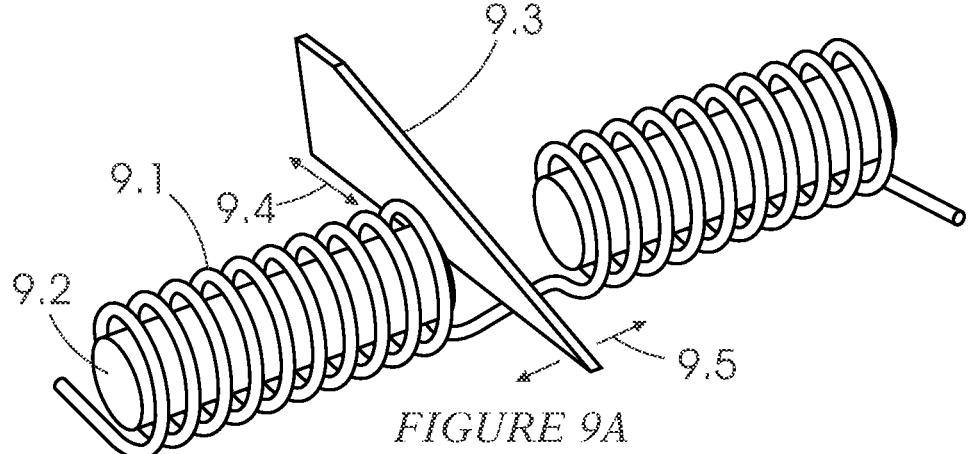
Figure 9B:
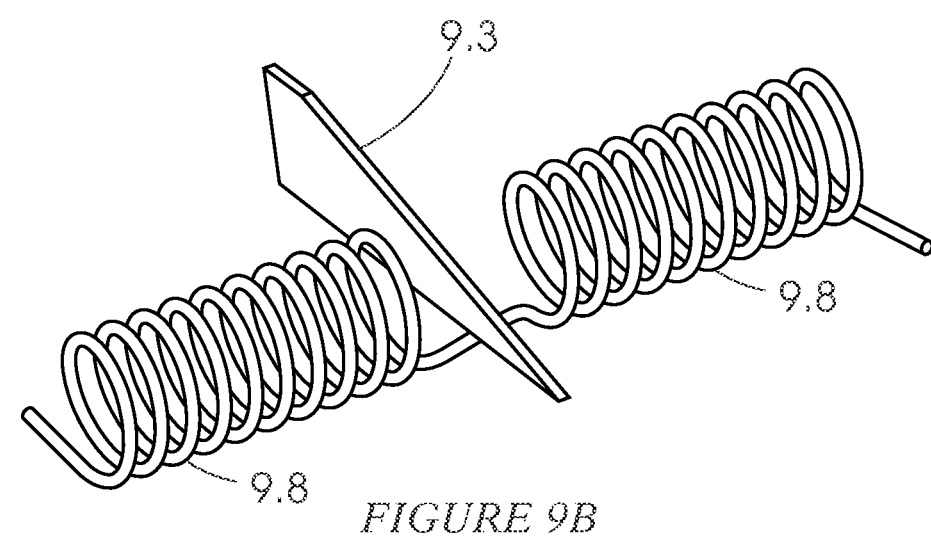

In another embodiment of the invention an inductor is formed in two parts that are linked but with a gap between the two parts (FIGS. 9A and 9B). A conducting member, preferably flat, can be moved perpendicularly into this gap resulting in a change in inductance that is related to the movement of such interfering member. This construction has the advantage that sideways movement of the interfering member has a much lower influence on the inductance than the perpendicular movement cutting through the magnetic flux lines in the core of the inductor.

In a further embodiment the interfering member may be tapered or shaped in a pointed manner to get the full change of inductance over a much longer distance of motion compared to when a flat edge is used. This construction may be very advantageous for a trigger mechanism where the moving part(s) are outside and the coil (two parts) plus other electronics are inside a sealed housing resulting in a cost effective but extremely robust solution. This mechanism can even work submerged in water.

The use of ferrites inside the two halves of the coil may increase the distance that the two halves may be apart without creating stray effects due to the loose coupling of the magnetic flux between the halves.

Capacitive touch detection may be used for safety and/or calibration purposes to determine a release or zero position. This position zero may be constantly recalibrated to take all factors (voltage, temperature, construction etc.) influencing the measurement into account. It can then facilitate a very accurate start.

In a further embodiment the inductive measurements may be used to reflect the speed of motion (trigger activation or button press), the depth of motion, other actions or non-actions, return to zero position (trigger, switch or joystick) in order to effect intelligent user interface decisions. For example, pressing and holding at a position for a predetermined period of time may result in a decision for a lock at that position when the trigger is released. Any future press may immediately cancel that selection. This may be applied to, for example, power tools.

Another button may be used to activate this freezing of "speed" function i.e. the setting (for example drill speed) is set even when the user releases the trigger. This setting may be cancelled upon a further button press or another activation of the trigger.

In a further embodiment the adjustment of, for example, rotation speed of a drill may be zoomed in after a lock decision. For example, before the zoom in, a movement of 1 mm on the trigger may have resulted in a 100 rpm change in rotation speed but, after the lock decision a 1 mm move only results in 10 rpm change. This innovation may be used in other applications of rotational or linear measurements. The "zoom in" function may also be activated using a separate button.

In a further embodiment the interfering member may be designed to linearize the resulting change of inductance due to displacement. This will avoid having to linearize the measurements in software.

In another embodiment the interfering member(s) may be designed to result in a more digital type signal. This may be especially useful when limited levels (i.e. resolution) are required and it offers advantages in robustness against noise and drift due to environmental effects. The interfering member(s) may be sized and positioned to ensure a continuous increasing effect in one direction and a continuous decreasing effect in the other direction. This may be important when measurements are taken at high speed.

In a further embodiment the interfering member may be designed to enable the determination of an unequivocal starting position. This can also be tied to an electronic haptic or mechanical tactile sensation.

Apart from an inductance which comprises flat coils on one or more sides of a pcb, which may be planar, the invention finds particular application with an inductance of a solenoid coil type wherein a plurality of windings extend around a longitudinal core which extends in an axial direction—in one application linearly (in a straight line); in another application, suited for example for a joystick or thumb stick, the core may extend along an arc e.g. of a circular shape. This allows pivotal or rotational movement of the interfering member at least along a limited arc or distance but in a way such that the member remains inside the core.

The member may be linear or curved with a constant or varying cross sectional area, include a plurality of step changes, comprise a number of discreet components which are spaced apart in a desired relationship or be formed from one or more types of materials, in order to achieve different types of measurement functions.

In one embodiment the inductor is a solenoid-type inductor and comprises a plurality of windings which extend around a core with a longitudinal axis and wherein the interfering member is movable in the core along said longitudinal axis.

Various methods can be used to measure the inductance. Two methods are described with one method based on a resonant tank circuit and another based on a charge transfer implementation. The charge transfer implementation offers advantages in terms of component count and implementation cost.

BRIEF DESCRIPTION OF THE DIAGRAMS

FIGS. 1A and 1B—Interfering with inductors using metal plates: a typical prior art implementation.

FIG. 2—Change in inductance due to overlap and proximity: graph showing measured result that highlights the prior art problem if there is any change in proximity.

The invention is further described with reference to the following drawings:

FIG. 3A—Magnetic flux line around a solenoid inductor.

FIG. 3B—Moving a rod into an inductor to change inductance.

FIG. 4—Change in inductance due to insertion and side-ways movement: graph showing improved performance based on invention.

FIG. 5—Typical resonant tank circuit: a resonant tank circuit that can be used to measure change in inductance.

FIG. 6—Inductive based rotation sensing for a joystick: showing how the invention can be applied to a joystick to replace rheostat, Hall effect and electromechanical encoders.

Figure 7A:
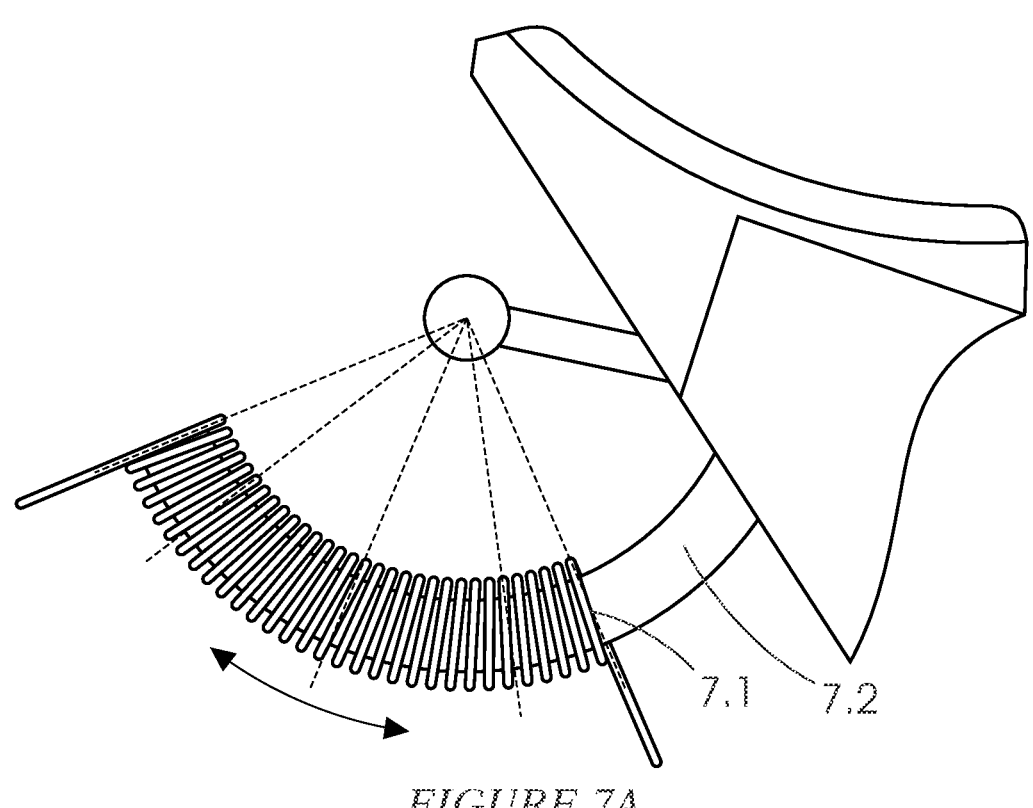
Figure 7B:
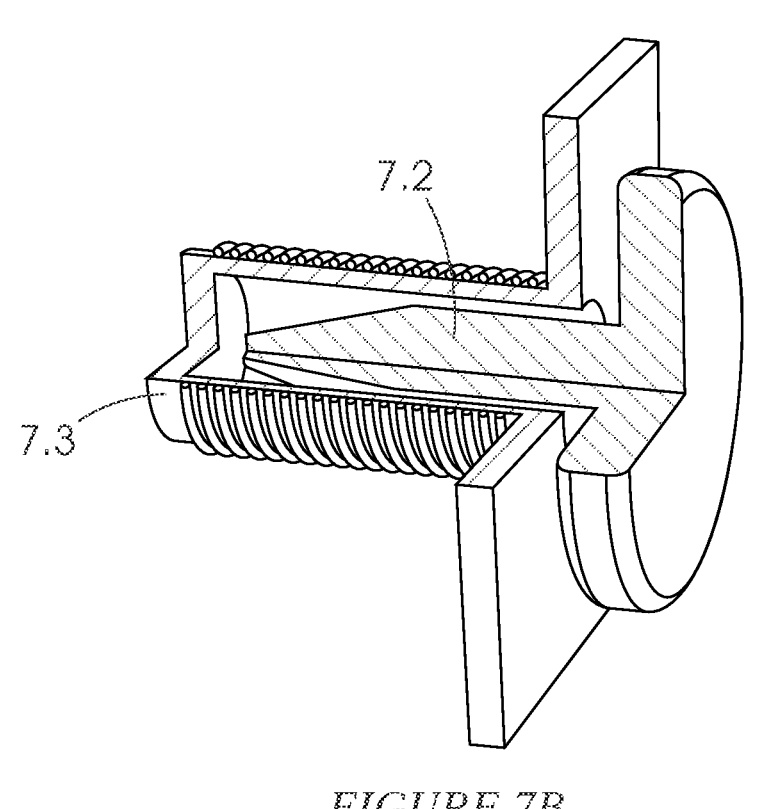

FIGS. 7A and 7B—Inductive based sensing for a trigger application.

FIG. 8—Changing the inductance of a pcb inductor: showing how the invention can be used to implement contactless inductive switches with a coil formed on a pcb.

FIGS. 9A and 9B—Changing the inductance by moving an interfering member perpendicular to a length of a coil.

Figure 10:
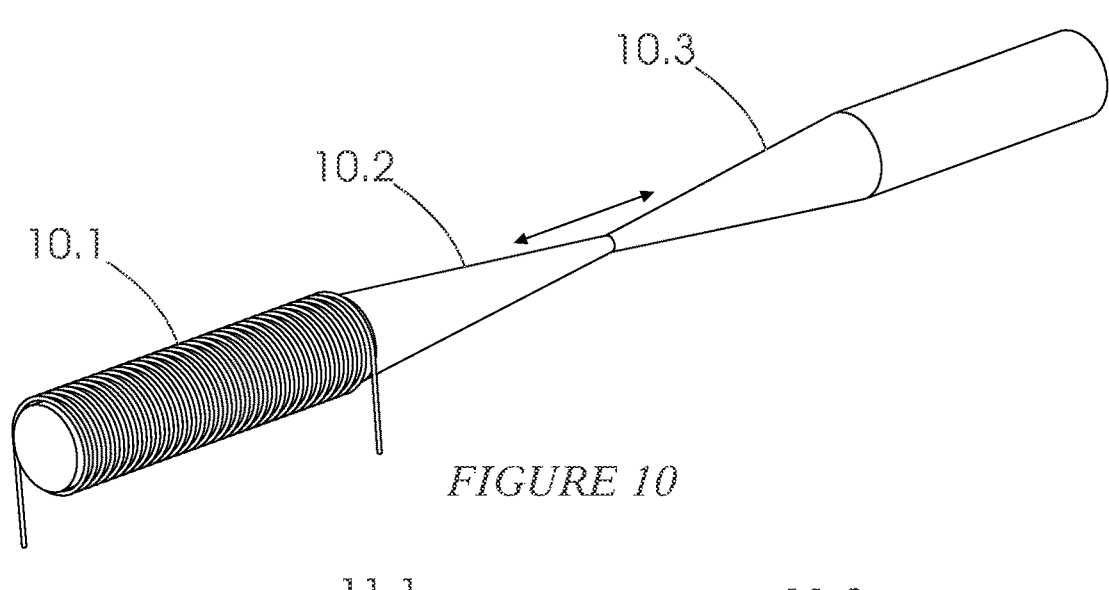

FIG. 10—Enhanced change of inductance by using different materials such as metal on one half and ferrite on other half.

Figure 11:
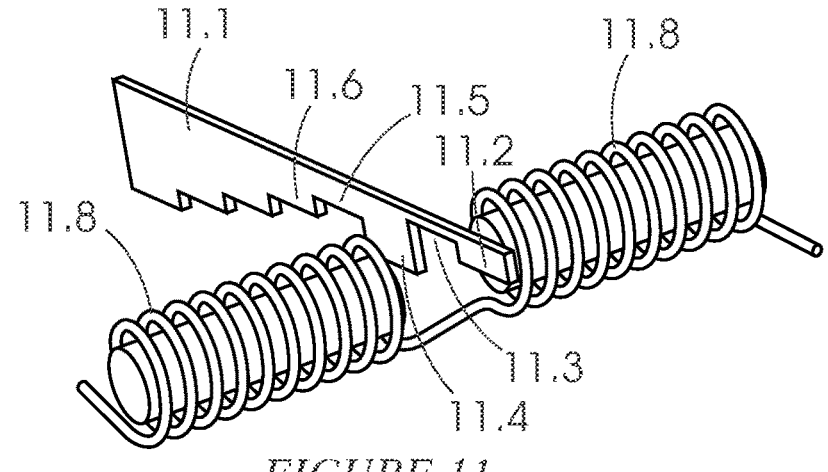

FIG. 11—A structure to provide an identifiable start sequence and a 5 step wedge for changing the measured inductance.

Figure 12:
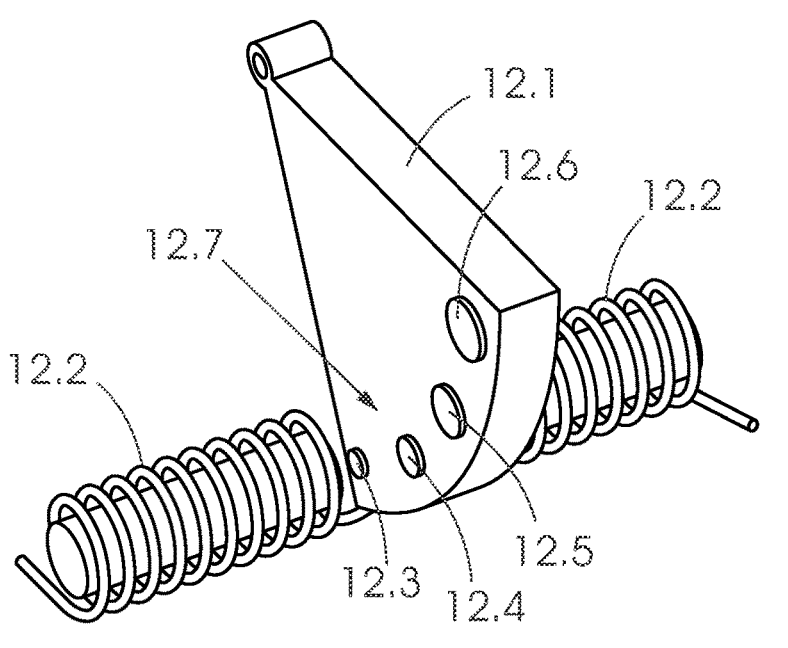

FIG. 12—Increasing sequence of individual interfering member rod diameter to create a digital type sequence of inductive measurement changes as the different sizes move through magnetic fields.

Figure 13:
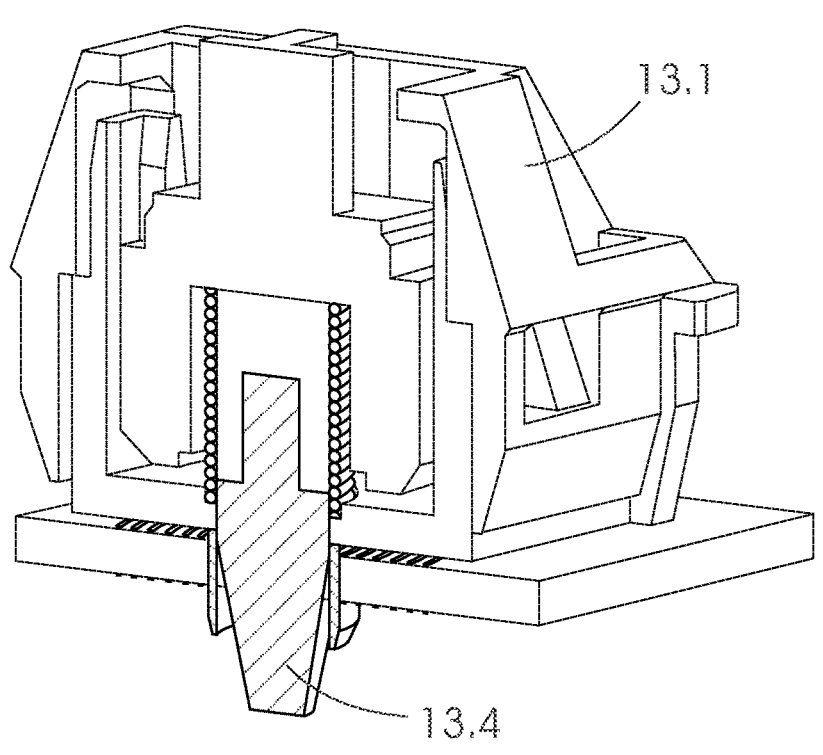
Figure 13:
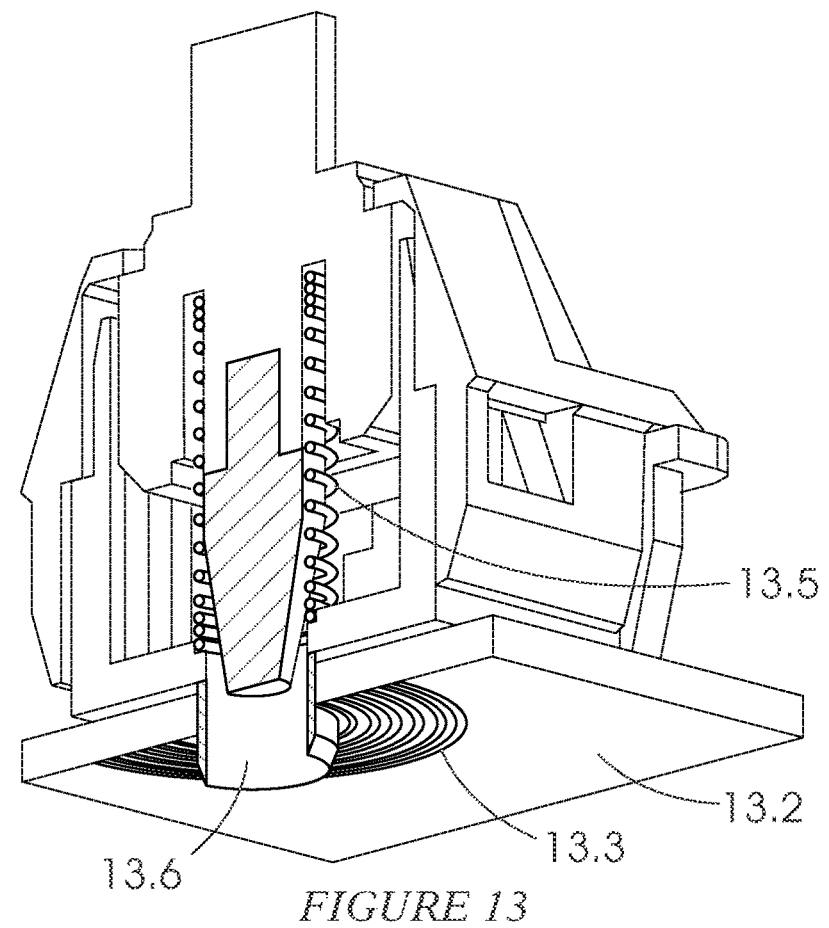

FIG. 13—A drawing of a keyboard type switch that is non-contact and use of an interfering member to change the inductance of an inductor that is laid out on a printed circuit board.

Figure 14A:
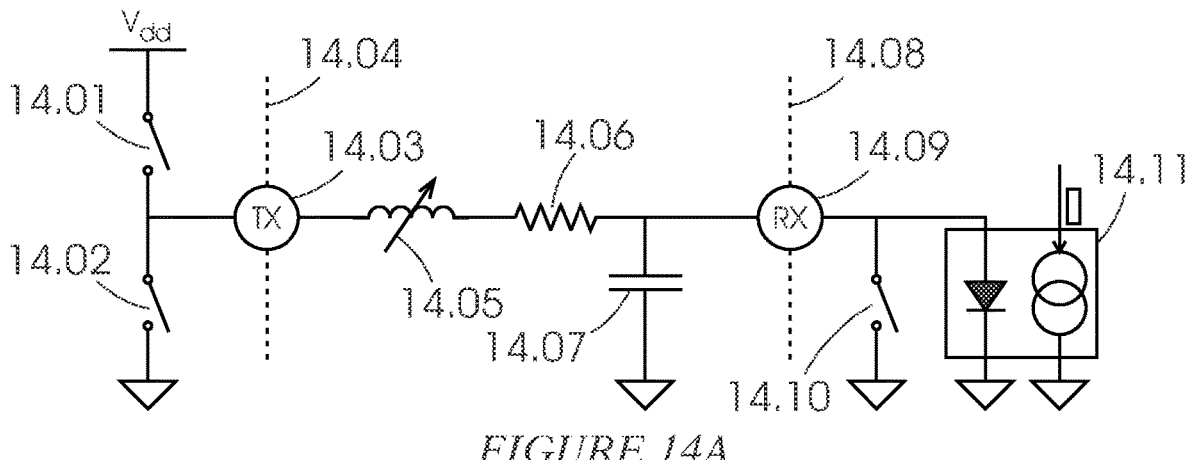
Figure 14B:
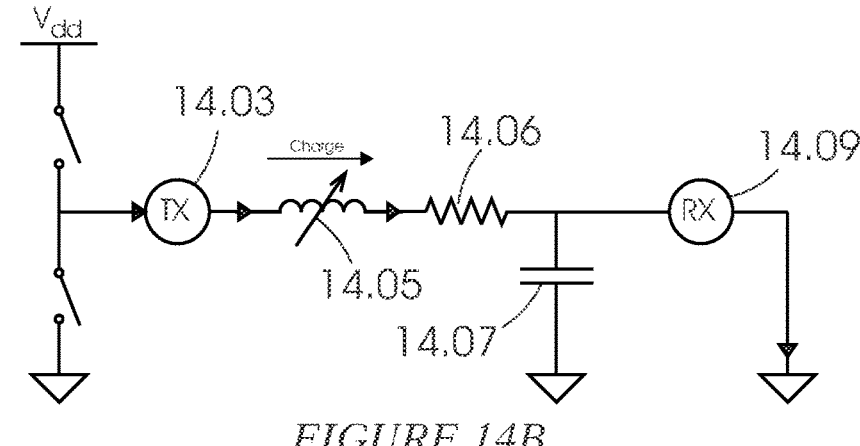
Figure 14C:
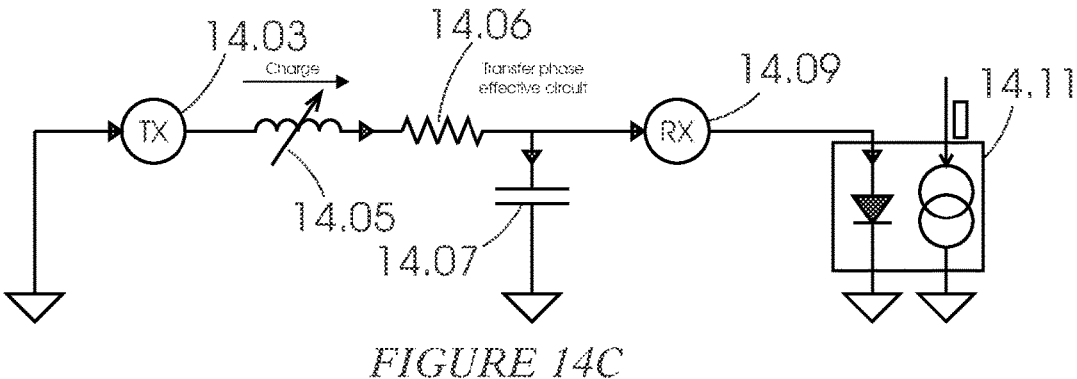

FIGS. 14A to 14C—Inductive charge transfer measurement circuit.

DETAILED DESCRIPTION OF THE INVENTION

The following description of the appended drawings is presented merely to clarify the spirit and scope of the present invention, and not to limit such scope. These are merely exemplary embodiments, and a large number of alternatives or equivalent embodiments may exist which will still fall within the scope of the claims for the present invention.

FIG. 3B presents an exemplary embodiment of a key concept of the present invention i.e. moving an interfering member 3.2 into an inner core (volume) of an inductor 3.1, thereby affecting the inductance of the said inductor. The advantage is that the magnetic field inside the inductor core is evenly spread (FIG. 3A-3.10) hence movement of the member 3.2 off center does not have a significant effect and therefore makes production easier and operation more reliable. The depth of insertion is reflected in the measured inductance as shown in FIG. 4. The measurement shows that unlike in the construction of FIGS. 1A and 1B, the movement of the rod off-center does not create measurement uncertainty. This means reduced noise and more accuracy and movement measurement resolution. The guide structure 3.3 can be done in any manner. The graph in FIG. 4 shows that linearity is affected near the ends of the inductor i.e. fringe effects.

The change in inductance can be measured in many ways for example but not limited to: self inductance, a tank circuit FIG. 5, frequency of an LC circuit. In the example of FIG. 5 the inductance forms part of a resonant tank and the output feeds into a charge transfer measurement circuit. A change in inductance results in a change of the V at point 5.3.

FIG. 6 represents an embodiment of the invention applied to the rotational measurement of the axis in a joystick. The axle 6.5 is attached to an interfering member 6.3 that moves inside a coil 6.2 to reflect a user's movement of a member 6.1. The typical 30 degrees to a side moves between the dotted lines at ends of 6.6 and the structure of 6.3 does not need to make contact with anything other than the attachment to the axle. The contacts 6.4 are traditional joystick rheostat electrical contacts of which only two are now required for the two sides of the inductor 6.2. The same is required for the other axle.

The joystick mechanism can be housed in a metal skeleton 6.9 that is grounded to the pcb through tab 6.7. However, in a further embodiment the metal skeleton 6.9 or other conductor is used to determine touch by a user at a button 6.10 with capacitive sensing i.e. not for grounding any more. The structures 6.10, 6.11 are conductive and the capacitive measurement can be done through electrical connection e.g. the user touching the button 6.10, electrical connection through structure 6.11, capacitive coupling between 6.11 and the metal skeleton 6.9, the contact 6.7 of the housing 6.9 soldered into a pcb (not shown) and an electrical connection circuit to the measurement IC.

FIG. 7A represent an embodiment of the invention applied to the measurement of movement of a typical trigger mechanism as applied for example to gaming consoles or power tool devices. The concept is similar to the mechanism discussed for FIG. 6. The trigger movement is shown with an arc, but it can also be linear as in FIG. 7B. The coil 7.1 can also be inside a sealed housing, with the interfering member 7.2 outside as shown in FIG. 7B where 7.3 shows the sealed cylinder wherein the interfering member can move in or out.

A further embodiment is shown in FIG. 8 where the inductor is formed as a flat coil 8.1 on a single side or two sides of a pcb with a hole 8.3 through the pcb in the center of the coil. The interfering member 8.2 starts interfering with the inductor 8.1 before entry and then the interference increases as it is inserted further into the hole. If the member 8.2 is conductive the inductance is diminished and if it is ferrite (high permeability) the inductance is enhanced.

This configuration can also be useful to implement, for example, a key in a computer keyboard. By enhancing the inductance, a coil with enough inductance may be implemented with a small diameter and this may assist in placing the keys closer together without getting crosstalk, between adjacent coils, that results in noise or false measurements.

The member 8.2 may be constructed with a non-interfering material (e.g. plastic) as in 8.6 to act as a guide. The member 8.2 may also be part of a key construction 8.4 moving up and down inside a tube that is permanently pushed through the hole 8.3.

In a further embodiment of the invention the magnetic fields of the inner core of the inductor are interfered with by moving a member 9.3 in the direction 9.4 through the gap between the 2 parts of the coil 9.1 (FIG. 9A).

The coil may include ferrite cores 9.2 or may be air cores (FIG. 9B). The advantage is again because of the homogeneous nature of the magnetic field inside the core, movement of member 9.3 in direction 9.5 changes very little of the inductance. Movement in direction 9.4 does, however, make a significant impact.

In FIG. 10 an interfering member constructed of ferrite and metal is shown that can be guided into the inner core of a coil 10.1. When the maximum amount of metal (say 10.2) is inside the core, the inductance will be at a minimum and with the maximum amount of ferrite (10.3) into the core, the inductance of the inductor will be at maximum. This construction can be used to achieve a larger change in inductance than using just one type of material. In other words, more signal and more resolution or less noise. By using the inductance measured value when the interfering member is outside the coil as a reference type level the cross over value from metal to ferrite can act as a hard trigger point. By reversing the construction so that the narrow points are outside and the connection between the ferrite and metal is at maximum diameter, a very fast transition can be achieved. I.e. a very clear trigger point especially if the coil length is short. For example, a flat pcb coil.

In FIG. 11 an embodiment that is closely related to the example in FIG. 9A is shown. When the interfering member 11.1 is outside the gap between the two parts of the inductor the inductive measurement has a certain reference value. If the member is metal such as copper, then as a part 11.2 is moved into the gap, the inductance measured will reduce. As a part 11.3 is moved into the gap, the inductance measured for the inductor 11.8 will rise. When a part 11.4 is moved into the gap the inductance will drop again. Since the ratio between 11.2, 11.3 and 11.4 is known the inductive measurements can be correlated against what is expected and a clear initial position can be established on a relative basis even if the inductance absolute values have changed due to other reasons for e.g. temperature. This embodiment has a stepped sequence of parting i.e. the formations or components 11.2, 11.3, 11.5 etc.

Further movement will either result in a value approximately equivalent to 11.2, that would indicate further movement in the same direction, or a value of 11.3 that would mean the direction is reversed.

If the direction remains the same as when started, the values resulting from more interference such as formations 11.6 will be measured. In the case of a trigger mechanism the controller can then react and provide signals in accordance. For example a drill can be controlled for stepwise increasing the drill speed. If the member is removed from the sequence 11.4 then 11.3, then 11.2 and then no interference, the measurements will clearly indicate the direction out and the removal of the interference. The controller may then for example stop a drill from rotating or indicate for example zero activation on a gaming trigger mechanism.

If the interfering member 11.1 is of a material such as ferrite then the value of inductance will increase as more interfering material is moved into the gap.

The relative measurements are important to remove uncertainties due to drift in the inductance measured. It is possible to distinguish between a constant drift and a displacement of the interfering member that results in a specific pattern of inductance change exhibiting flat regions.

In another embodiment the size of part 11.4 can be the maximum i.e. to fully cover the diameter of the coil and this may assist in determining the minimum and maximum change that can be expected in the measurements.

When the movement is expected to be at high speed, the dimensions of parts 11.2, 11.3 and 11.4 (interfering members) may be enlarged in the direction of movement to ensure a proper reading is taken with the interference stabilized for the specific interference.

The same concept can be easily adapted for use in the construction according to FIG. 8. The rod diameter needs to change in steps and follow the same sequence of bigger and smaller diameters.

In FIG. 12 several completely separated interfering members in the form of rods or components 12.6, 12.5, 12.4 etc. are used. The material of 12.1 can be plastic i.e. very little or no effect on the inductance. As each interfering member is moved into the center of the gap, between the coils, the inductance changes in relation to the member's diameter.

The distance 12.7 that is between 12.3 and 12.4 may be chosen so that the inductance does not return to the level where no interfering member is moved into the gap. In this way it is possible to determine direction once 12.3 has been recognized i.e. when following detection of 12.3 the next inductance is that of no interference then the direction was reversed, however after 12.3 if the next measurements show a lower level of interference but not no interference then the movement is further in the same direction. If the member is made of ferrite then the inductance will rise as the member's diameter becomes bigger.

For higher speed operation the interfering members may be positioned adjacent to the extent that measurements will have a continuous increasing effect in one direction and a continuous decreasing effect in an opposing direction.

The concept of creating a starting sequence can also be implemented as per FIG. 11.

In another embodiment the interfering member 11.1 (made of ferrite or metal) can be shaped and embedded in 12.1 in place of the rods (12.3, etc.) to provide a continuous change in inductance against displacement.

In FIG. 13 an embodiment is shown using an interfering member 13.4 to interfere with the magnetic flux of an inductor 13.3. When a switch 13.1 is pressed by a user, interfering member 13.4 is moved deeper into the core of the inductor 13.3. An interfering member 13.4 of ferrite will enhance the inductance and an interfering member 13.4 of metal will reduce the inductance of 13.3.

Using double sided pcb and forming the inductor 13.3 on both sides provides better performance (i.e. change in inductance) based on the magnetic flux formed in the longer core.

A locating guide 13.6 helps to create stable operation but reduces the diameter of the member 13.4. If the switch 13.1 can be positioned with other locating pins the guide 13.6 can be removed and the member 13.4 can be enlarged to have a bigger effect on the inductance.

The spring 13.5 may also influence the inductance. If a metal interfering member 13.4 is used with a metal spring 13.5 compression of the spring will augment the effect of the member 13.4. But when a ferrite interfering member 13.4 is used a metal spring may work against the change per displacement and it may be better to use a plastic type spring or a spring positioned away from the inductor.

FIG. 14A shows a circuit to measure inductance of a variable inductor using charge transfer method of implementation. In this example everything left of dotted line 14.04 and to the right of dotted line 14.08 is inside an inductive measurement integrated circuit and between the dotted lines is outside the measurement integrated circuit (IC).

A Tx pad 14.03 is connected to the inductor 14.05. A resistor 14.06 is used to limit the current flow. A capacitor 14.07 is used as a filter to remove radio frequency and other noise but is also parasitic in the sense that there is capacitance which is associated with the IC pads and tracks.

An Rx pad 14.09 feeds current flow (charge) from the inductor circuit into the IC and connects to a current mirror circuit 14.11 that forms a part of a regular charge transfer measurement circuit as is known in the art.

Switches 14.01, 14.02 and 14.10 are used to control charging and discharging as per FIGS. 14B and 14C. In FIG. 14B, the switches 14.01 and 14.10 (FIG. 14A) are closed and current flows into the inductor to generate a magnetic field with the input side to the integrated circuit shorted to ground during the charging phase. This state is kept for a period long enough to have the current stabilize.

In the transfer phase (FIG. 14C) the switches 14.01 and 14.10 (FIG. 14A) are opened and switch 14.02 (FIG. 14A) is closed to form a flyback path. The charge from the collapsing magnetic field flows into the measurement circuit (e.g. current mirror 14.11) to facilitate measuring the inductance of the inductor 14.05.

The invention claimed is:

1. A method of measuring movement of a component relative to a structure wherein the structure comprises an inductor with a core and the component includes an interfering member linked to a lever or trigger mechanism, said lever or trigger mechanism being rotationally movable to a limited extent about a rotational axis and wherein the interfering member is at least partially positioned inside the core of the inductor at a zero position, and is rotationally moveable about said rotational axis while remaining inside said core in response to a user press applied to said lever or trigger mechanism, and wherein the method includes the steps of using the interfering member to interfere with the magnetic field of said inductor by moving the interfering member into the core of said inductor, measuring a change in the inductance of the inductor in response to said movement and relating the change in the measured inductance to said movement relative to the inductor, or to the position of the interfering member inside the core of the inductor.

2. The method of claim 1 wherein the inductor is a solenoid-type inductor and comprises a plurality of windings which extend around a core with a longitudinal axis and wherein the interfering member is movable in the core along said longitudinal axis.

3. The method of claim 1 wherein the inductor comprises a flat coil formed on at least one side of a printed circuit board and lies in a plane, and wherein the interfering member is movable relative to the coil in a direction which is perpendicular or substantially perpendicular to said plane.

4. The method of claim 1 applied in a joystick or thumb stick device.

5. The method of claim 1 wherein said structure further comprises a capacitance measurement circuit which determines if there is contact between a user and the lever or trigger mechanism and a device which uses information pertaining to such contact for calibration purposes.

6. The method of claim 1 wherein the inductor comprises a solenoid-type conductor with a first and second part, said first and second part being separated by a gap extending along a longitudinal direction, and wherein the inductor further comprises a plurality of windings which extend around a longitudinal core and wherein the interfering member is movable into the core at said gap in a direction which is transverse to the longitudinal axis of the core.

7. The method of claim 6 wherein the interfering member is selected from the following: an interfering member of irregular cross section, an interfering member with a plurality of stepped formations; and an interfering member comprising a plurality of spaced apart components.

8. The method of claim 1 wherein the inductance is measured using a charge transfer measurement process and wherein the method includes the step of shorting one end of the inductor to ground during each charging phase of the charge transfer measurement process.

9. The method of claim 1, wherein the interfering member is a metal member or a ferrite member.

10. An inductive sensor for measuring movement of a component relative to a structure, wherein said structure comprises an inductor with a core, and wherein said component comprises an interfering member that is coupled to a lever or trigger mechanism, said lever or trigger mechanism being rotationally movable to a limited extent about a rotational axis and wherein the interfering member is at least partially positioned inside the core of the inductor at a zero position, and is rotationally moveable about said rotational axis while remaining inside said core of said inductor in response to a user press applied to said lever or trigger mechanism, wherein the interfering member is used to interfere with the magnetic field of said inductor when the interfering member moves into the core of said inductor, and wherein a change in the inductance of the inductor is measured in response to said movement to relate the change in the measured inductance to said movement relative to the inductor, or to relate the change in the measured inductance to the position of the interfering member inside the core of the inductor.

11. The inductive sensor of claim 10, wherein the interfering member is a metal member or a ferrite member.

12. The inductive sensor of claim 10 wherein the inductor is a solenoid-type inductor and comprises a plurality of windings which extend around a core with a longitudinal axis and wherein the interfering member is movable in the core along said longitudinal axis.

13. The inductive sensor of claim 10 wherein the inductor comprises a flat coil formed on at least one side of a printed circuit board and lies in a plane, and wherein the interfering member is movable relative to the coil in a direction which is perpendicular or substantially perpendicular to said plane.

14. The inductive sensor of claim 10 wherein said sensor is used in a joystick or thumb stick device.

15. The inductive sensor of claim 10 wherein said structure further comprises a capacitance measurement circuit which determines if there is contact between a user and the lever or trigger mechanism and a device which uses information pertaining to such contact for calibration purposes.

16. The inductive sensor of claim 10 wherein the inductor comprises a solenoid-type conductor with a first and second part, said first and second part being separated by a gap extending along a longitudinal direction, and wherein the inductor further comprises a plurality of windings which extend around a longitudinal core and wherein the interfering member is movable into the core at said gap in a direction which is transverse to the longitudinal axis of the core.

17. The inductive sensor of claim 16 wherein the interfering member is selected from the following: an interfering member of irregular cross section, an interfering member with a plurality of stepped formations; and an interfering member comprising a plurality of spaced apart components.

18. The inductive sensor of claim 10 wherein the inductance is measured using a charge transfer measurement process and wherein one end of the inductor is shorted to ground during each charging phase of the charge transfer measurement process.

* * * * *